(12) United States Patent
Ciurpita et al.

(10) Patent No.: US 6,516,068 B1
(45) Date of Patent: Feb. 4, 2003

(54) MICROPHONE EXPANDER

(75) Inventors: Greg Ciurpita, Somerset, NJ (US);
Scott Pennock, Naperville, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/139,183

(22) Filed: Aug. 25, 1998

(51) Int. Cl.[7] .............................. H03G 7/00; H03G 3/00
(52) U.S. Cl. ...................................... 381/106; 381/107
(58) Field of Search .................................. 381/104, 106, 381/107, 108, 109; 333/14; 379/390.01

(56) References Cited

U.S. PATENT DOCUMENTS

| | | | | |
|---|---|---|---|---|
| 4,044,309 A | * | 8/1977 | Smith | 381/107 |
| 4,071,695 A | * | 1/1978 | Flanagan et al. | |
| 4,466,119 A | * | 8/1984 | Peters et al. | 330/136 |
| 5,359,653 A | * | 10/1994 | Walker et al. | 379/390.01 |
| 5,631,968 A | * | 5/1997 | Frey et al. | 333/14 |

* cited by examiner

Primary Examiner—Forester W. Isen
Assistant Examiner—Brian T. Pendleton

(57) ABSTRACT

A microphone expander attenuates background noise in a digitized microphone signal from a wireless telephone by using a loss function that exhibits hysteresis when the signal is passing through a transition range. This allows the microphone expander to apply loss more effectively because it allows for decreases in speech levels without attenuation. An attenuation level is determined using a first loss function when an averaged signal, derived from the digitized microphone signal using an algorithm that causes the averaged signal to clearly exhibit speech components in the digitized microphone signal, increases from below a lower noise threshold. However, if the averaged signal increases to above an upper speech threshold and then decreases to below that threshold, the attenuation level is determined using a different loss function, which delays introducing loss into the microphone signal as compared to the first loss function. The thresholds are increased, the amount of hysteresis is decreased, and the minimum amount of loss is increased as the noise level increases. The noise level is derived from the averaged signal using an algorithm that isolates noise components. Thus, the exact loss applied to any given sample of the microphone signal can be tailored to account for phenomena such as the tendency of people to speak louder when there is more background noise.

18 Claims, 2 Drawing Sheets

MICROPHONE EXPANDER

BACKGROUND OF THE INVENTION

1. Field of the Invention

The present invention relates to a microphone expander and, more particularly, to a microphone expander that effectively reduces background noise.

2. Description of Related Art

Microphone-expanders have been used to electronically alter the linear sensitivity of electret microphones so that they mimic the response of carbon microphones, which are less sensitive to low-level signals. This lack of sensitivity to low level signals has the incidental effect of reducing the transmission of background noise, which is typically at a lower level than speech signals. That is, in carbon microphones gain can be applied to the microphone signal to transmit the user's speech more clearly, while still keeping the noise level in the signal at an acceptable level.

FIG. 3 depicts a conventional microphone expander circuit that attempts to mimic that effect in conventional telephones. The signal from a telephone microphone 1 is introduced to an expander logic circuit 2 and an amplifier 3. The expander logic circuit 2 generates a loss that is applied to the amplifier 3 to adjust the signal from the microphone 1.

The expander logic circuit 2 makes a short-term measurement of the microphone signal and generates a loss signal according to the function shown in FIG. 4. The loss function is characterized by an upper threshold $T_U$, above which all loss is removed. In FIG. 4 the upper threshold $T_U$ is 80 dB SPL, at which the loss becomes zero and the speech is passed unattenuated by the amplifier 3. There is a lower threshold $T_L$ below which the maximum loss is applied. In FIG. 4 the lower threshold $T_L$ is 71 dB SPL, at which the loss is 15 dB (a gain of −15 dB). In between the two thresholds, the attenuation represented by the loss varies according to the level of the microphone signal. In the example shown in FIG. 4, the loss varies linearly between the two thresholds.

Conventional microphone expanders such as that shown in FIG. 3 can also be used to enhance the signal at the telephone receiver by using the expanded microphone signal output by the expander logic circuit. As shown in FIG. 3, a side tone path 4 introduces the expanded microphone signal to an amplifier 5, which attenuates the signal by 12 dB. This attenuated signal is added to the signal at the telephone receiver 6, thus resulting in a corresponding noise reduction in the received signal.

However, a difficulty with conventional microphone expanders in a noisy environment is that the difference between speech and noise cannot be defined simply in terms of signal level. As a result, using the microphone signal level to distinguish between the voice signal and unwanted noise is inherently unreliable. In other words, since the conventional approach simply attenuates signals depending on their level, noise at the same level as speech will be passed on as if it were speech.

U.S. Pat. No. 4,847,897 discloses another type of microphone expander, which attempts to measure noise utilizing signal properties that typically distinguish it from speech. The measured noise level is used to determine the amount by which to attenuate the microphone signal in the absence of a strong speech signal. This approach uses the noise level to determine the amount of loss to insert in the microphone signal and as an indication of the presence of speech. However, it does not address the problem of how to adjust the attenuation applied to the microphone signal across the normal range of speech and noise levels.

U.S. Pat. Nos. 3,889,059 and 3,963,868 describe speakerphones in which noise and voice levels are detected and used to alter a microphone signal. However, they too fail to address the problem of how to adjust the attenuation applied to a microphone signal across a range of speech and noise levels, particularly in a cellular telephone environment where noise levels can be especially severe.

SUMMARY OF THE INVENTION

It is an object of the present invention to provide a microphone expander that avoids the shortcomings of the prior art.

It is another object of the invention to provide an improved manner to determine how much loss to apply to a microphone signal by using loss functions that exhibit hysteresis, and, in another aspect of the invention, the thresholds defining the loss functions can be changed as the noise level changes so that the final signal is as optimal as possible.

In accordance with a first broad aspect of the invention, a microphone expander for attenuating background noise in a microphone signal comprises a signal averaging circuit for generating an averaged signal including speech components in the microphone signal, and a loss adjusting circuit for determining an amount of attenuation to be added to the microphone signal, wherein the loss adjusting circuit determines the attenuation from a first loss function if the averaged signal increases from below a lower noise threshold and from a second loss function if the averaged signal decreases from above an upper speech threshold, the first loss function providing more attenuation than the second loss function for a given averaged signal level.

In accordance with another broad aspect of the invention, such a microphone expander further comprises a noise level averaging circuit for generating a noise level signal representing background noise in the microphone signal and a threshold adjusting circuit for changing the first and second loss functions if the noise level signal exceeds a predetermined value.

In accordance with a more specific embodiment of the invention, a microphone expander for attenuating background noise in a digitized microphone signal from a wireless telephone comprises:

a signal averaging circuit for generating from an input signal an averaged signal including speech components in the microphone signal by sampling the digitized microphone signal in accordance with the following algorithm:

$$s_t = s_{t-1} + \frac{p_t - s_{t-1}}{d1} \quad \text{if } p_t \geq s_{t-1}$$

$$s_t = s_{t-1} + \frac{p_t - s_{t-1}}{d2} \quad \text{if } p_t < s_{t-1}$$

where:
500/sec<sampling rate<1000/sec,
$P_t$=the new sample,
$s_{t-1}$=the old signal average,
$s_t$=the new signal average, and
d1<d2;

a noise level averaging circuit for generating a noise level signal representing background noise in the microphone signal by sampling the averaged signal in accordance with the following algorithm:

$$n_t = n_{t-1} + \frac{s_t - n_{t-1}}{d3} \quad \text{if } s_t \geq n_{t-1}$$

$$n_t = n_{t-1} + \frac{s_t - n_{t-1}}{d4} \quad \text{if } s_t < n_{t-1}$$

where:
500/sec<sampling rate<1000/sec,
$s_t$=the new averaged signal sample,
$n_{t-1}$=the old noise average,
$n_t$=the new noise average, and
d3>>d4;

a threshold adjusting circuit for determining parameters range, transition and hysteresis, range being an upper speech threshold minus a quantity determined by adding a predetermined margin to the noise level, transition being the lesser of (i) range multiplied by a factor less than one, and (ii) a default value TRANSITION determined by multiplying a predetermined maximum value for range by the factor, and hysteresis being the lesser of (i) range minus transition, and (ii) a default value HYSTERESIS determined by subtracting TRANSITION from the predetermined maximum value for range;

a loss adjusting circuit for determining a parameter delta that is the lesser of (i) transition, and (ii) the averaged signal minus a quantity determined by subtracting transition from an upper speech threshold, if a first loss function provides the amount of attenuation, or the averaged signal minus a quantity determined by subtracting transition plus hysteresis from the upper speech threshold, if a second loss function provides the amount of attenuation, or zero if delta is negative, wherein the first loss function provides the attenuation if the averaged signal increases from below a lower noise threshold defined as the upper speech threshold minus the quantity transition plus hysteresis, and the second loss function provides the attenuation if the averaged signal decreases from above the upper speech threshold, the first loss function providing more attenuation than the second loss function for a given averaged signal level when the averaged signal is less than the upper speech threshold and greater than the lower noise threshold; and a loss calculating circuit for determining the attenuation to be applied to the microphone signal by multiplying a loss multiplier by a quantity determined by subtracting delta from TRANSITION.

The present invention is particularly adapted to implementation with a microprocessor.

BRIEF DESCRIPTION OF THE DRAWINGS

The present invention will be better understood from the detailed description of its preferred embodiments which follows below, when taken in conjunction with the accompanying drawings, in which like numerals refer to like features throughout. This brief identification of the drawing figures will aid in understanding the detailed description that follows.

DETAILED DESCRIPTION OF THE PREFERRED EMBODIMENTS

Figure 1:
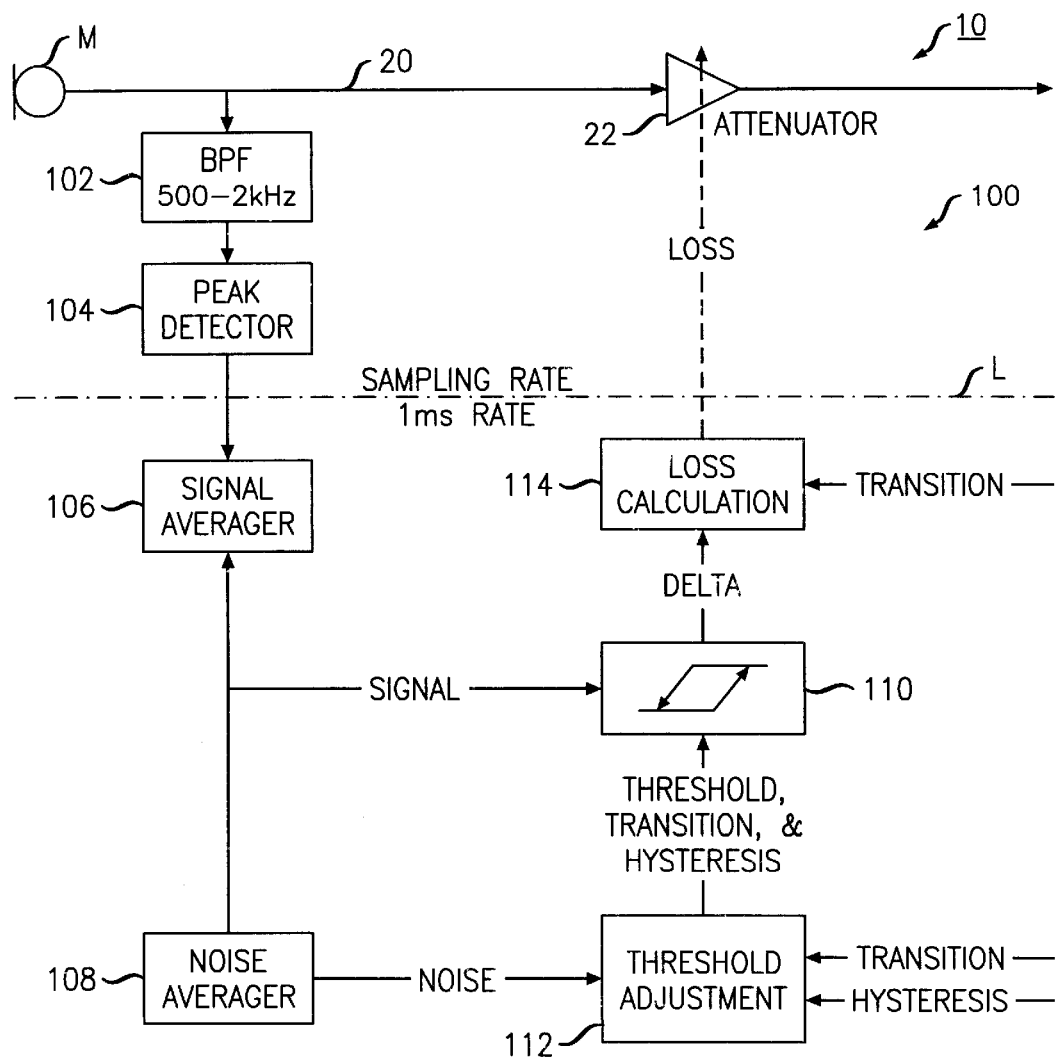
FIG. 1 shows a preferred embodiment of a microphone expander circuit according to the present invention.

FIG. 1 illustrates a microphone expander circuit 10 in accordance with a preferred embodiment of the present invention. An input line 20 carries a signal from a microphone M. Typically, the microphone signal will be converted by an analog-to-digital converter (not shown) into a 13-bit pulse code modulated signal generated at a sampling rate of 8 KHz. However, the invention is neither limited to use with such a signal, nor even, in its broadest aspects, to use with digital signals. The voice signal line 20 is introduced to an attenuator/amplifier 22, which provides an amount of attenuation determined by the amount of loss input from a control circuit 100 according to the present invention. The signal output from the attenuator/amplifier 22 is input to the side tone path and is also transmitted to a remote location in the conventional manner.

The control circuit 100 includes a band-pass filter 102 that accepts the digitized microphone signal from the input line 20. The filter 102 passes signals above a frequency of 500 Hz and below a frequency of 2000 Hz. It is known that when there is a significant amount of noise, the noise level is greater than the speech level below 500 Hz. It is also known that almost all speech energy is below 2000 Hz. Accordingly, the band-pass filter 102 assures that only that part of the signal likely to contain more speech than noise is processed by the remainder of the control circuit. Those skilled in the art will understand that the filter 102 in effect provides a signal that reflects an A-weighted sound level measurement.

The filtered signal is then introduced to a peak detector 104, which, like the band-pass filter 102, typically operates at the signal sampling rate (here 8 Hz). The peak detector 104 is a type of sample-and-hold circuit that samples the filtered signal and holds the absolute value thereof. In the peak detector 104, however, the held value is replaced by a subsequent sampled value if the absolute value of that subsequent sampled value exceeds the currently held value. The value being held by the peak detector is reset to zero by a signal averaging circuit 106 as discussed below. The signal averager 106 therefore averages what corresponds to an "envelope" of the digitized microphone signal.

The signal averager 106 is adapted from conventional components used for generating information about voice signals in speakerphones. It samples the output of the peak detector 104 at a predetermined rate less than the digital sampling rate (here 8 KHz) and resets the peak detector to zero after it takes each sample. It develops an averaged signal according to the following equations:

$$s_t = s_{t-1} + \frac{p_t - s_{t-1}}{4} \quad \text{if } p_t \geq s_{t-1} \quad (1)$$

$$s_t = s_{t-1} + \frac{p_t - s_{t-1}}{32} \quad \text{if } p_t < s_{t-1} \quad (2)$$

where:
the sampling rate is 667/second
$P_t$=the new peak sample
$s_{t-1}$=the old signal average
$s_t$=the new signal average.

Equations (1) and (2) produce a signal that contains a representation of the speech components in the signal. Those skilled in the art will appreciate this from the denominators in the equations. The denominator in equation (1) is small (here four), so that the output signal produced by the averager 106 will tend to "attack" relatively quickly, meaning that it will respond quickly to increases in the envelope signal from the peak detector 104. In contrast, the denominator in equation (2) is large (here 32), so that the output of the signal averager 106 will tend to "decay" much more slowly, meaning that it will respond slowly to decreases in the envelope signal. Accordingly, the averaged signal contains the peaks in the filtered microphone signal, which, when speech is present, represent the speech level.

The sampling rate used in the signal averager 106 is important, since it will affect the extent to which the resulting signal can be deemed to represent the speech components in the microphone signal. Typically, the sampling rate is chosen to approximate the rate at which a speaker pronounces separate syllables, the so-called "syllabic rate." For a typical speaker, a syllable lasts about 100 milliseconds (msec), and it has been found that a signal sampling rate of about 667/second (a sample period of 1.5 msec) provides sufficient response to produce an averaged signal that accurately reflects the speech level. It is believed that a sample period of 2 msec provides the slowest sampling rate consistent with the goal of capturing every syllable in the speech. A sampling rate that is too fast (above about 1000/second) provides an insufficient number of samples to represent the speech in the signal, and will not accurately measure the envelope of the speech. All components above the phantom line L in FIG. 1 operate at the signal sampling rate, while those below the phantom line operate at the chosen syllabic rate.

The noise level averager 108 samples the averaged signal output by the signal averager 106 at a predetermined rate to determine a noise level average according to the following equations:

$$n_t = n_{t-1} + \frac{s_t - n_{t-1}}{4096} \text{ if } s_t \geq n_{t-1} \qquad (3)$$

$$n_t = n_{t-1} + \frac{s_t - n_{t-1}}{4} \text{ if } s_t < n_{t-1} \qquad (4)$$

where:
the sampling rate is 667/second
$s_t$=the new averaged signal sample
$n_{t-1}$=the old noise average
$n_t$=the new noise average.

Equations (3) and (4) produce a signal that represents the noise in the signal. The denominator in equation (3) is large (here 4096), so that the signal produced by the noise level averager 108 will tend to "attack" very slowly, meaning that it will respond slowly to increases in the signal from the signal averager 106. In contrast, the denominator in equation (4) is small (here four), so that the signal from the noise detector will tend to "decay" much more quickly, meaning that it will respond quickly to decreases in the envelope signal. Accordingly, the output signal from the noise level averager 108 represents an average of the valleys in the output of the signal averager 106. Since the averaged signal output from the signal averager 106 has a certain DC bias that represents noise in the signal, detecting the valleys in the signal in effect detects the noise level in the output of the signal averager 106. In other words, for any given sample, the output of the signal averager 106 typically will have a non-zero component. The noise level averager 108 produces an output that represents a particular kind of "average" of the minimum values of those non-zero components. That average corresponds to the valleys in the signal and thus detects the non-speech components (or noise) in the signal.

As shown in FIG. 1, the sampling rate used in the noise level averager 108 is typically the same as that used in the signal averager 106. As explained above, it is important that the sampling rate properly reflect the "syllabic rate." Otherwise, the adjustments to the microphone signal to be made in accordance with the present invention (as explained below) will not accurately reflect the actual properties of the speaker's voice.

Equations (1)–(4) are based on algorithms previously used in speakerphones, as set forth in U.S. Pat. No. 5,007,046, which is incorporated herein as if set forth in full. It should be understood that the present invention is not limited to use of these particular algorithms for detecting the levels of the portions of the signal representing speech and noise, respectively.

In accordance with the present invention, the output of the signal averager 106, which in accordance with the above discussion can be deemed to represent the sound energy level of the speech components in the microphone signal 20, is introduced to a loss adjuster circuit 110. This circuit outputs a signal delta using the function depicted in FIG. 2.

Figure 2:
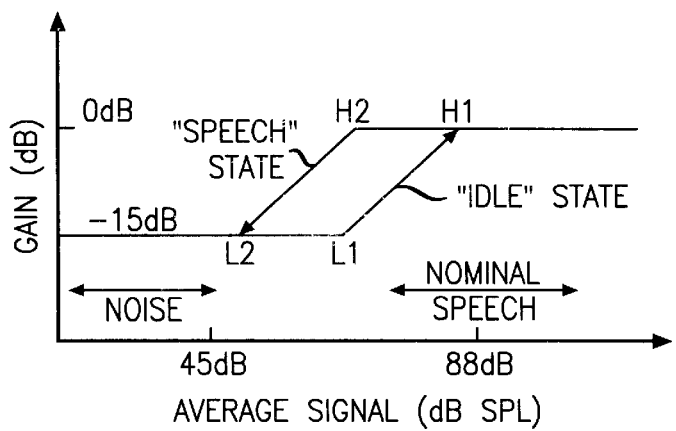
FIG. 2 illustrates the application of loss to a microphone signal according to the present invention.

In FIG. 2 the ordinate depicts the loss (represented as negative gain) in decibels to be applied to the microphone signal by the attenuator/amplifier 22, and the abscissa represents the output from the signal averager 106 in dB SPL. The parameter delta, determined from this curve, is used to determine the loss in a manner discussed in detail below.

FIG. 2 illustrates conceptually an important principle of operation of the present invention. Consider first a case in which the microphone signal is in a so-called "idle" state, when no speech is present (determined as discussed below). In that case, the loss will be determined by a first loss function curve L2–L1–H1. In other words, the loss is a maximum (here 15 dB) as the averaged signal level from the signal averager 106 increases to a lower threshold L1. The loss then decreases linearly to zero as the averaged signal level increases to the higher threshold H1, and then remains at zero as the averaged signal level continues to increase above H1.

According to an important feature of the present invention, when the averaged signal level decreases from above H1 to below H1, the microphone signal is in a so-called "speech" state, and the loss is determined by following a second loss function curve H1–H2–L2. In other words, the loss stays at its minimum value of zero dB until it falls below H2, at which point it decreases linearly as the averaged signal level decreases to L2, at which the loss remains at 15 dB as the averaged signal level continues to decrease. If the averaged signal level then increases above L2, the loss again changes according to the curve L2–L1–H1, as before.

That is, unlike known prior art microphone expanders, the amount of loss added to the microphone signal depends on the direction in which the averaged signal level enters the transition zone between L2 and H1. This is accomplished by including a state machine in the loss adjuster circuit 110. This state machine determines for each sample of the average signal whether the average signal is above H1 or below L2. If so, it then determines if the next sample is below H1 or above L2, respectively. If the signal has changed state from above H1 to below H1, the circuit 110 follows the curve H1–H2–L2; if the signal has changed state from below L2 to above L2, the circuit follows curve L2–L1–H1. If the circuit detects no state change the loss is determined from the curve used for the preceding sample.

Thus, the present invention introduces the concept of hysteresis into the loss determination, since the amount of loss introduced into the microphone signal depends on whether the averaged signal (representing speech) is increasing or decreasing. The implications of using hysteresis in determining loss are significant and are discussed in detail further below.

In accordance with another important aspect of the invention, the output of the noise level averager 108 is used to alter the amount of loss added by the attenuator/amplifier 22. This is accomplished in a threshold adjuster circuit 112.

Figure 4:
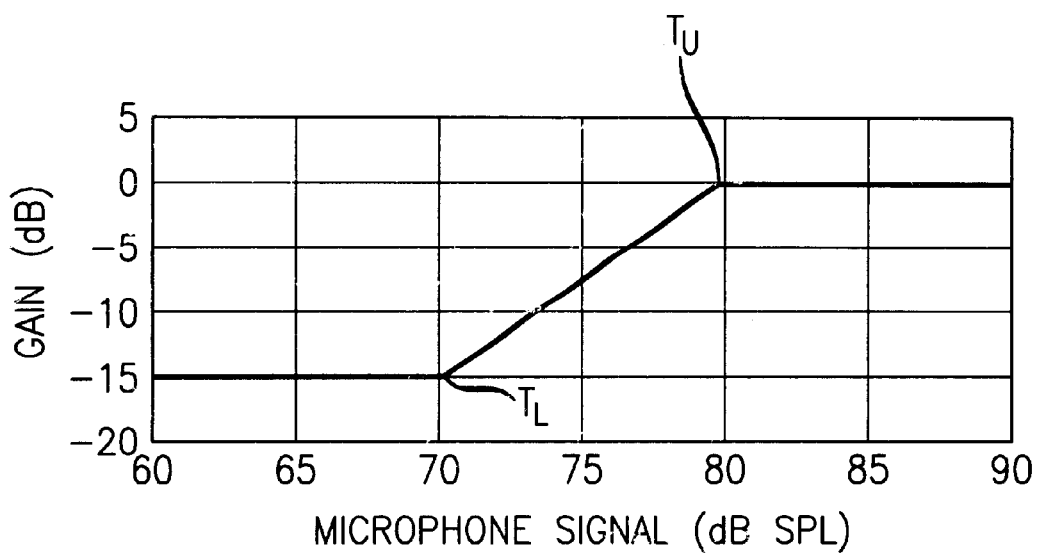
FIG. 4 illustrates a typical loss function used by the conventional expander logic circuit shown in FIG. 6.

Beginning with the upper speech threshold H1, it is increased from a constant-speech threshold by a predetermined amount as the output from the noise level averager 108 increases above a given level. The constant-speech threshold is slightly less than the expected energy level in a microphone signal under "normal" conditions, that is, when noise is not present and when a speaker is talking at a comfortable level. It has been shown that a speaker will not talk any louder than this threshold if the background noise level is below 50 dBA. In the prior art loss function depicted in FIG. 4 the constant-speech threshold is chosen as 80 dB SPL. In a preferred embodiment of the present invention, it is chosen as 84 dB SPL.

The threshold adjuster circuit 112 begins with the chosen value for H1 and "constructs" loss functions as in FIG. 2. Initially, it will be appreciated that for the expander circuit 100 to operate properly the lower noise threshold L2 must always be higher than the noise level. Otherwise, the state machine discussed above would be "trapped" on the H1–H2–L2 curve, since the average signal would never fall below an L2 above the noise level. Accordingly, a parameter range is defined as range=H1–noise level–margin. In the present embodiment, margin is set to 1 dB, the effect being to maintain the lower noise threshold L2 at least 1 dB above the noise level represented by the output of the noise level averager 108.

Next, the threshold adjusting circuit 112 uses the current values for range and H1 to determine the remaining parameters needed to define the hysteresis curve depicted in FIG. 2 and enable calculation of the loss for a given signal sample.

Two parameters, transition and hysteresis, are determined using those values. The parameters transition and hysteresis in effect define the upper noise threshold L1 and the lower speech threshold H2, respectively. (In the present embodiment, H2−L2 =H1−L1 and H2−H1=L2−L1, although the invention is not limited to such a relationship.) These parameters are first calculated as follows:

$$\text{transition}=k*\text{range} \quad (5)$$

$$\text{hysteresis}=\text{range}-\text{transition} \quad (6)$$

In the present embodiment, k=0.5, so hysteresis=transition.

The threshold adjusting circuit 112 then compares the values of transition and hysteresis to default values, TRANSITION and HYSTERESIS, respectively. The default values are determined by choosing a maximum value for range; then TRANSITION=k*$\text{range}_{max}$ and HYSTERESIS= $\text{range}_{max}$−TRANSITION. In the present embodiment, $\text{range}_{max}$ is chosen as twice the normal 9 dB range over which loss is applied in a typical prior art loss function such as that shown in FIG. 4. Accordingly, since k=0.5, TRANSITION=HYSTERESIS=9 dB. The circuit 112 outputs to the loss adjusting circuit 110 the upper speech threshold value H1, represented in FIG. 1 as a parameter threshold, along with the values for transition and hysteresis. Regarding the latter, if k*range>TRANSITION, the parameter transition is set equal to TRANSITION, and if range*(1−k)>HYSTERESIS, the parameter hysteresis is set equal to HYSTERESIS. The parameters threshold, transition and hysteresis completely define the curves depicted in FIG. 2.

In accordance with this embodiment of the invention, the default values TRANSITION and HYSTERESIS are used until the measured noise level increases to above 50 dB SPL. In that case, the lower speech threshold is 66 dB SPL, which can be appreciated by considering that range=84−50−1=33, whereby L2 will be 66 dB SPL (H1−$\text{range}_{max}$). In other words, transition and hysteresis will both be set to their default values TRANSITION and HYSTERESIS when the noise level is less than 50 dB SPL and H1=84 dB SPL. Accordingly, as long as the measured noise level from the noise level averager 108 is below 50 dB SPL, H1 is 84 dB SPL and L2 is 66 dB SPL.

However, when the measured noise level increases above 50 dB SPL, H1 is increased by 2.5 dB for every 10 dB increase in the measured noise level above 50 dB SPL. This is based on the known phenomenon that a speaker talks between 3 dB to 6 dB louder for every 10 dB increase in the measured noise level above 50 dBA. The amount by which H1 is increased is less than the observed increase in speech level to prevent the introduction of excessive attenuation as the noise level increases. In any event, it will be appreciated that L2 will also shift the same amount up to a noise level of 70 dB SPL, since range>$\text{range}_{max}$ until that noise level is reached, as explained below. This has the effect of shifting the hysteresis curve in FIG. 2 upward along the abscissa. That is, until the noise level reaches 70 dB SPL, transition and hysteresis both remain at their default values of 9 dB, but loss will be added to the microphone signal at higher levels of the averaged signal than in environments in which the measured noise level is under 50 dB SPL.

This feature of the invention reflects the fact that people talk louder in the presence of more background noise. Therefore, it can be expected that the averaged signal from the signal averaging circuit 106 will increase. Adding loss to the microphone signal under such circumstances will attenuate the increased background noise, but not result in a loss of the speech component of the signal since it is also at a higher level under such conditions.

Yet another aspect of the invention relates to threshold adjustment when the measured noise level exceeds 70 dB SPL. In that case, range<$\text{range}_{max}$, having the effect of raising the lower noise threshold L2 one dB for every dB increase in the measured noise level. However, the upper speech threshold continues to increase 0.25 dB for every one dB increase in the measured noise level. This has the effect of compressing the hysteresis curve in FIG. 2. This will be better understood by considering an example of this feature of the invention.

For a measured noise level of 70 dB SPL, range=H1 (89)−noise level (70)−margin (1)=18. Then, 0.5*range=(1−0.5)*range=9, so that transition=hysteresis=9. However, if the measured noise level is, say 78 dB SPL, then range=H1 (91)−noise level (78)−margin (1)=12. Then, 0.5*range=(1−0.5)*range=6, so that transition =hysteresis=6, because this is less than the default value of 9. This means that as the measured noise level increases to these excessive levels, the maximum amount of loss is inserted at a higher signal level than would otherwise be the case. It also has the effect of increasing (from zero) the minimum amount of loss inserted into the signal, as a result of the manner in which the actual loss inserted into the microphone signal is determined.

To determine the exact loss to be inserted into the microphone signal, the loss adjuster circuit 110 calculates a parameter delta. For the "idle" state delta is the lesser of transition or the averaged signal–(H1–transition). For the "speech" state delta is the lesser of transition or the averaged signal–[(H1–(transition+hysteresis)]. If the value either of the averaged signal–(H1–transition) or of the averaged signal–[H1–(transition+hysteresis)] is negative, then delta=0. In effect, delta corresponds to the "location" of the averaged signal on the relevant loss function curve.

A loss calculation circuit 114 calculates from delta the loss inserted by the attenuator/amplifier 22. The circuit 114 subtracts delta from TRANSITION and then multiplies the result by a loss multiplier. The loss multiplier generally corresponds to the slope of the transition portion of the relevant loss function curve in FIG. 2 in the low noise condition (below 50 dB SPL). In the present embodiment, that value would be 1.67 (15 dB maximum loss over a signal transition of 9 dB). However, one of the advantages of the manner in which the present invention determines the actual loss is that the loss multiplier can be any value that produces the most advantageous results. In another preferred embodiment, it is chosen as 2.0.

The operation of the present invention can be appreciated by considering some working examples of the present embodiment. When the measured noise level is less than 70 dB SPL, transition=TRANSITION. Therefore, if delta is less than TRANSITION, then loss=the quantity (TRANSITION–delta) multiplied by the loss multiplier of 1.67. This is the condition that prevails when the averaged signal is lower than the speech threshold for the relevant loss function. On the other hand, when delta=transition=TRANSITION, meaning that the averaged signal is in the speech region (above the upper speech threshold) of the relevant loss function, loss=0. If the averaged signal is below the noise threshold for the relevant loss function, the maximum loss of 15 dB is inserted.

When the measured noise exceeds 70 dB SPL, the present invention exhibits several phenomena. Taking the example above, in which the measured noise level was 78 dB SPL, consider first a signal level of 83 dB SPL while the state machine is in the speech state. In that case transition=hysteresis=6, and delta=averaged signal–(H1–[(transition+hysteresis)]=83–79=4. Then, the loss is (9–4)*1.67=8.33. If the state machine is in the idle state under these conditions, the averaged signal–(transition)=83 –84 =–1, whereby delta=0. The loss is (9–0)*1.67=15 dB, which is the maximum loss.

If the averaged signal is at the upper speech threshold of 91 dB when the measured noise level is 78 dB SPL, then in the speech state transition=hysteresis=delta=6, because the averaged signal–H1 [(transition+hysteresis)]=12. The loss will be (TRANSITION–delta)*1.67=5 dB. Thus, in this case loss is inserted even when the averaged signal is at the upper speech threshold.

From the above discussion, it will be appreciated that the microphone expander of the present invention reduces the amount of loss introduced to the microphone signal as the noise level increases. This enables the invention to account for the fact that a speaker will talk louder in the presence of noise, so that introducing loss even in the presence of speech will not affect microphone performance. Above a certain noise level, the maximum loss is always taken out regardless of speech level. By doing so, the present invention maintains the signal level at a more reasonable level even in the presence of extremely excessive noise.

It will also be appreciated that when the measured noise level increases to a certain value, the microphone expander according to this embodiment of the invention will insert loss regardless of the averaged signal level. This occurs because the lower noise threshold eventually reaches a value that is the same as the upper speech as the noise level continues to increase. In that event, the maximum amount of loss is inserted because transition becomes 0 regardless of the signal level, so that delta=0. This reflects the expected reaction of the speaker to talk so loudly in the presence of high background noise that adding the maximum loss will actually reduce the microphone signal to a more normal level.

The loss adjusting circuit 110, threshold adjusting circuit 112 and the loss calculating circuit 114 will typically be provided as a microprocessor programmed to perform as described above. They are depicted herein as separate circuits for the sake of describing their operation. However, it is within the scope of the invention to embody these circuits in other ways, such as separate logic circuits using TTL logic elements.

Figure 3:
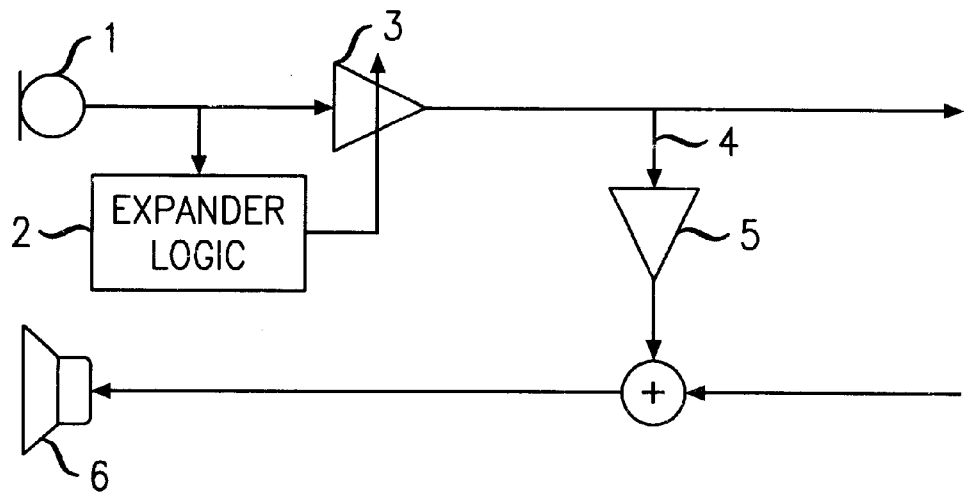
FIG. 3 is a schematic circuit diagram of a conventional microphone expander circuit.

It will be appreciated that the expanded signal will not only be transmitted to a remote location as a telephone signal, but also will be introduced to the side tone path as well, as in the prior art shown in FIG. 3.

The present invention is particular well adapted for use in a mobile telephone environment. In a quiet environment such as an office, the background noise is not only low but also stable. However, in a mobile setting, such as a car or busy street or sports stadium, noise is not only greater but extremely dynamic as well. The optimum microphone expander should be capable of changing the loss it adds to the microphone signal in a manner that accounts for these properties. The present invention, by using a dynamic loss function that uses hysteresis to account for various phenomena present in actual speech. For example, speech levels trail off at the ends of words, thus mimicking termination of speech and triggering signal attenuation in conventional microphone expanders. However, the loss function with hysteresis according to the present invention accounts for that phenomenon by using a different loss curve once it is established that speech has begun. The present invention also enables dynamic adjustment of the loss function depending on the noise level. Accordingly, the threshold at which the maximum loss is inserted can be adjusted as the noise level increases. Moreover, the manner in which the invention is implemented enables that feature to be used to account for the fact that people speak louder in the presence of background noise.

While preferred embodiments of the invention have been depicted and described, it will be understood that various changes and modifications can be made other than those specifically mentioned above without departing from the spirit and scope of the invention, which is defined solely by the claims that follow.

What is claimed is:

1. A microphone expander for attenuating background noise in a microphone signal, the microphone expander comprising:

a signal averaging circuit for generating an averaged signal including speech components in the microphone signal; and a loss adjusting circuit for determining an amount of attenuation to be added to the microphone signal, wherein said loss adjusting circuit determines the attenuation from a first loss function if the averaged signal increases from below a lower noise threshold and from a second loss function if the averaged signal decreases from above an upper speech threshold, the first loss function providing more attenuation than the second loss function for a given averaged signal level.

2. A microphone expander as in claim 1, further comprising:
   a noise level averaging circuit for generating a noise level signal representing background noise in the microphone signal; and
   a threshold adjusting circuit for changing the first and second loss functions if the noise level signal exceeds a predetermined value.

3. A microphone expander for attenuating background noise in a microphone signal, the microphone expander comprising:
   a signal averaging circuit for generating an averaged signal including speech components in the microphone signal; and
   a loss adjusting circuit for determining an amount of attenuation to be added to the microphone signal, wherein said loss adjusting circuit determines the attenuation from a first loss function if the averaged signal increases from below a lower noise threshold and from a second loss function if the averaged signal decreases from above an upper speech threshold, the first loss function providing more attenuation than the second loss function for a given averaged signal level, wherein:
      the first loss function provides a first predetermined amount of attenuation until the averaged signal increases to an upper noise threshold representing the upper speech threshold minus a quantity determined by subtracting the lower noise threshold from the upper speech threshold and multiplying the result by a factor less than one, and then linearly decreases the amount of attenuation until the averaged signal increases to the upper speech threshold, after which the attenuation provided by the first loss function is maintained at a second amount; and
      the second loss function provides the second amount of attenuation until the averaged signal decreases to a lower speech threshold representing the upper speech threshold minus a quantity determined by subtracting the lower noise threshold from the upper speech threshold and multiplying the result by one minus the factor, and then linearly increases the amount of attenuation until the averaged signal decreases to the lower noise threshold, after which the amount of attenuation provided by the second loss function is maintained at the first predetermined amount.

4. A microphone expander as in claim 3, further comprising:
   a noise level averaging circuit for generating a noise level signal representing background noise in the microphone signal; and
   a threshold adjusting circuit for increasing the lower noise threshold, the upper noise threshold, the lower speech threshold and the upper speech threshold if the noise level signal exceeds a predetermined value.

5. A microphone expander as in claim 4, wherein said threshold adjusting circuit increases the lower noise threshold more than the upper speech threshold if the noise level exceeds a second predetermined value greater than the first-mentioned predetermined value.

6. A microphone expander for attenuating background noise in a microphone signal, the microphone expander comprising:
   a signal averaging circuit for generating an averaged signal including speech components in the microphone signal;
   a loss adjusting circuit for determining an amount of attenuation to be added to the microphone signal, wherein said loss adjusting circuit determines the attenuation from a first loss function if the averaged signal increases from below a lower noise threshold and from a second loss function if the averaged signal decreases from above an upper speech threshold, the first loss function providing more attenuation than the second loss function for a given averaged signal level;
   a noise level averaging circuit for generating a noise level signal representing background noise in the microphone signal;
   a threshold adjusting circuit for changing the first and second loss functions if the noise level signal exceeds a predetermined value, and
   a loss calculating circuit for calculating the attenuation to be applied to the microphone signal from a parameter delta, wherein:
      said threshold adjusting circuit determines parameters range, transition and hysteresis;
         range defines the lower noise threshold and is the upper speech threshold minus a quantity determined by adding to the noise level a margin for maintaining the lower noise threshold above the noise level;
         transition defines the upper noise threshold and is the lesser of (i) range multiplied by the factor, and (ii) a default value TRANSITION determined by multiplying a predetermined maximum value for range by the factor;
         hysteresis defines the lower speech threshold and is the lesser of (i) range minus transition, and (ii) a default value HYSTERESIS determined by subtracting TRANSITION from the predetermined maximum value for range; delta is the lesser of (i) transition, and (ii) the averaged signal minus a quantity determined by subtracting transition from the upper speech threshold, if the first loss function provides the amount of attenuation, or a quantity determined by subtracting transition plus hysteresis from the upper speech threshold, if the second loss function provides the amount of attenuation, or zero if delta is negative; and
      said loss calculating circuit determines the attenuation to be applied to the microphone signal by multiplying the difference between TRANSITION and delta by a loss multiplier.

7. A microphone expander as in claim 6, wherein:
   the upper speech threshold is 80 to 84 dB SPL;
   the factor is one-half;
   hysteresis and transition are the same for both loss functions;
   the predetermined maximum value for range is 18 dB; and
   the loss multiplier is at least 1.67.

8. A microphone expander as in claim 7, wherein the loss multiplier is 2.

9. A microphone expander as in claim 8, wherein said threshold adjusting circuit increases the upper speech threshold less than 1 dB for every dB change in the noise level signal above a predetermined noise level.

10. A microphone expander as in claim 9, wherein said threshold adjusting circuit increases the upper speech threshold 2.5 dB for every 10 dB change in the noise level signal above 50 dB SPL and the maximum amount of loss is 15 dB.

11. A microphone expander as in claim 7, wherein said threshold adjusting circuit, said loss adjusting circuit and said loss calculating circuit are implemented as a microprocessor.

12. A microphone expander for attenuating background noise in a digitized microphone signal from a wireless telephone, the microphone expander comprising:

a signal averaging circuit for generating from an input signal an averaged signal including speech components in the microphone signal by sampling the digitized microphone signal in accordance with the following algorithm:

$$s_t = s_{t-1} + \frac{p_t - s_{t-1}}{d1} \text{ if } p_t \geq s_{t-1}$$

$$s_t = s_{t-1} + \frac{p_t - s_{t-1}}{d2} \text{ if } p_t < s_{t-1}$$

where:
500/sec<sampling rate<1000/sec,
$P_t$=the new sample,
$s_{t-1}$=the old signal average,
$S_t$=the new signal average, and
d1<d2;

a noise level averaging circuit for generating a noise level signal representing background noise in the microphone signal by sampling the averaged signal in accordance with the following algorithm:

$$n_t = n_{t-1} + \frac{s_t - n_{t-1}}{d3} \text{ if } s_t \geq n_{t-1}$$

$$n_t = n_{t-1} + \frac{s_t - n_{t-1}}{d4} \text{ if } s_t < n_{t-1}$$

where:
500/sec<sampling rate<1000/sec,
$s_t$=the new averaged signal sample,
$n_{t-1}$=the old noise average,
$n_t$=the new noise average, and
d3>>d4;

a threshold adjusting circuit for determining parameters range, transition and hysteresis, range being an upper speech threshold minus a quantity determined by adding to the noise level a margin for maintaining the lower noise threshold above the noise level, transition being the lesser of (i) range multiplied by a factor less than one, and (ii) a default value TRANSITION determined by multiplying a predetermined maximum value for range by the factor, and hysteresis being the lesser of (i) range minus transition, and (ii) a default value HYSTERESIS determined by subtracting TRANSITION from the predetermined maximum value for range;

a loss adjusting circuit for determining a parameter delta that is the lesser of (i) transition, and (ii) the averaged signal minus a quantity determined by subtracting transition from the upper speech threshold, if a first loss function provides the amount of attenuation, or the averaged signal minus a quantity determined by subtracting transition plus hysteresis from the upper speech threshold, if a second loss function provides the amount of attenuation, or zero if delta is negative, wherein the first loss function provides the attenuation if the averaged signal increases from below a lower speech threshold defined as the upper speech threshold minus transition plus hysteresis, and the second loss function provides the attenuation if the averaged signal decreases from above the upper speech threshold, the first loss function providing more attenuation than the second loss function for a given averaged signal level when the averaged signal is less than the upper speech threshold and greater than the lower noise threshold; and a loss calculating circuit for determining the attenuation to be applied to the microphone signal by multiplying a loss multiplier by a quantity determined by subtracting delta from TRANSITION.

13. A microphone expander as in claim 12, wherein:

the digitized microphone signal is generated by sampling an analog microphone signal from a cellular telephone at a digital sampling rate of at least 8 MHz;

the upper speech threshold is 80 to 84 dB SPL;

the factor is one-half;

hysteresis and transition are the same for both loss functions;

the predetermined maximum value for range is 18 dB;

the loss multiplier is at least 1.67;

d1=4, d2=32, d3=4096 and d4=4;

the sampling rate is 667 samples per second; and the first loss function provides a first predetermined amount of attenuation until the averaged signal increases to an upper noise threshold representing the upper speech threshold minus transition, and then linearly decreases the amount of attenuation until the averaged signal increases to the upper speech threshold, after which the attenuation provided by the first loss function is maintained at a second amount; and the second loss function provides a second predetermined amount of attenuation until the averaged signal decreases to a lower speech threshold representing the upper speech threshold minus hysteresis, and then linearly increases the amount of attenuation until the averaged signal decreases to the lower noise threshold, after which the amount of attenuation provided by the second loss function is maintained at the first predetermined amount.

14. A microphone expander as in claim 13, further comprising:

a band-pass filter for filtering the digitized microphone signal to produce a filtered signal with components below a frequency of about 500 Hz and above a frequency of 2000 Hz substantially removed; and a peak detector circuit for accepting the filtered signal from said band-pass filter, said peak detector holding the absolute value of the filtered signal and replacing same if a current absolute value thereof exceeds a previously held absolute value thereof, wherein said peak detector circuit is sampled by said signal averaging circuit at the sampling rate thereof and reset to zero after each such sample.

15. A microphone expander as in claim 14, wherein said threshold adjusting circuit, said loss adjusting circuit and said loss calculating circuit are implemented as a microprocessor.

16. A microphone expander for attenuating background noise in a microphone signal, the microphone expander comprising:

means for generating an averaged signal including speech components in the microphone signal; and means for providing a parameter usable for determining an amount of attenuation to be added to the microphone signal, the attenuation being determined from a first loss function if the averaged signal increases from below a lower noise threshold and from a second loss function if the averaged signal decreases from above an upper speech threshold, wherein the first loss function provides more attenuation than the second loss function for a given averaged signal level.

17. A microphone expander as in claim 16, further comprising:

means for generating from the averaged signal a noise level signal representing background noise in the microphone signal;

means for changing the lower noise threshold and the upper speech threshold based on the noise level signal; and means for determining the attenuation to be applied to the microphone signal by using the parameter provided by said means for providing a parameter usable for determining an amount of attenuation to be added to the microphone signal.

18. A microphone expander as in claim 17, wherein said microphone expander is implemented as a microprocessor.

* * * * *